United States Patent
Kanakasabapathy et al.

(10) Patent No.: US 8,133,746 B2
(45) Date of Patent: Mar. 13, 2012

(54) METHOD FOR SEMICONDUCTOR GATE HARDMASK REMOVAL AND DECOUPLING OF IMPLANTS

(75) Inventors: Sivananda Kanakasabapathy, Albany, NY (US); Hemanth Jagannathan, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 12/714,702

(22) Filed: Mar. 1, 2010

(65) Prior Publication Data
US 2011/0212548 A1  Sep. 1, 2011

(51) Int. Cl.
*H01L 21/00* (2006.01)
*H01L 21/336* (2006.01)

(52) U.S. Cl. .............. 438/8; 438/301; 257/E21.529; 257/E21.438

(58) Field of Classification Search .............. 438/8, 301; 257/E21.529, E21.438
See application file for complete search history.

(56) References Cited

U.S. PATENT DOCUMENTS

| | | | |
|---|---|---|---|
| 7,928,514 B2* | 4/2011 | Bojarczuk et al. | 257/369 |
| 8,030,154 B1* | 10/2011 | Ozcan et al. | 438/230 |
| 2009/0029515 A1* | 1/2009 | Biery et al. | 438/301 |

* cited by examiner

*Primary Examiner* — Alexander Ghyka
*Assistant Examiner* — Seahvosh Nikmanesh
(74) *Attorney, Agent, or Firm* — F. Chau & Associates, LLC; Louis J. Percello, Esq.

(57) ABSTRACT

A method is provided for fabricating a semiconductor device having implanted source/drain regions and a gate region, the gate region having been masked by the gate hardmask during source/drain implantation, the gate region having a polysilicon gate layered on a metal layered on a high-K dielectric layer. The gate region and the source/drain regions may be covered with a self planarizing spin on film. The film may be blanket etched back to uncover the gate hardmask while maintaining an etched back self planarizing spin on film on the implanted source/drain regions. The gate hardmask may be etched back while the etched back film remains in place to protect the implanted source/drain regions. The gate region may be low energy implanted to lower sheet resistance of the polysilicon layer. The etched back film may be then removed.

13 Claims, 3 Drawing Sheets

METHOD FOR SEMICONDUCTOR GATE HARDMASK REMOVAL AND DECOUPLING OF IMPLANTS

BACKGROUND

1. Technical Field

The present disclosure relates to semiconductor devices, and, more particularly, to high performance CMOS fabrication.

2. Discussion of Related Art

In recent years the semiconductor industry has been striving to improve CMOS fabrication processing involving the removal of hardmasks without attacking source/drain regions, especially for those CMOS devices having high-k dielectrics and metal gates.

When CMOS devices are fabricated, for example, when using thick silicon on insulator (SOI) technology for better stress incorporation by epitaxial silicon germanium (e-SiGe) and epitaxial silicon carbon (e-SiC), the thick SOI requires high energy implants for butted junctions. Typically, the physical gate region's height has to be tall to prevent implant punch-through. However, to keep parasitic capacitances and module topography low the physical gate region may include both polysilicon (PC) and dielectric. For example, when gates are formed a thin PC gate may be layered on a metal gate, which, in turn, may be layered on a high-K dielectric covering the channel area. As such, the metal gate layer and high-K dielectric layer are typically covered by a hardmask to block the metal gate layer and high-K dielectric layer from deep source/drain implant.

FIG. 1 depicts such a hardmasking. SOI 110 may include implanted source/drain regions 112. Gate region 114 above channel region 116 of SOI 110 may include high-K dielectric layer 118 upon which is layered metal gate 120. PC gate 122 may be layered on metal gate 120. Hardmask 124 may cover PC gate 122. Spacers 126 may cover the sides of the gate region 114.

However, when the hardmask 124 blocks deep source/drain implants from penetrating the gate region 114, it also may block a silicidation processing of the gate region 114. In addition, low energy PC gate doping can be included to lower PC gate sheet resistance (rho) and the hardmask 124 would impede such doping.

As such, improving hardmask removal methodology such that the CMOS source/drain regions are not subject to attack, whether motivated by SOI, or where there may be a need to prevent punch-through of the dopants into metal gates and high-K dielectric layers such as for bulk Si technologies or other fabrication processes, has become an emerging requirement.

BRIEF SUMMARY

In accordance with exemplary embodiments of the present disclosure, a method of hardmask removal is provided which is useful for fabricating high performance CMOS semiconductor devices without attacking the source/drain regions.

In accordance with an exemplary embodiment, the application of implants needed for source/drain regions are decoupled from the application of implants provided for lowering the sheet resistance (rho) of the gate.

In accordance with an exemplary embodiment, a selective hardmask removal methodology allows for selectively blocking vulnerable implanted silicon while exposing the hardmask alone.

In accordance with an exemplary embodiment, a method is provided for fabricating a semiconductor device having implanted source/drain regions and a gate region, the gate region having been masked by the gate hardmask during a source/drain implantation, the gate region having a polysilicon gate layer layered on a metal layer that is layered on a high-K dielectric layer. The gate region and the source/drain regions are covered with a self planarizing spin on film. The self planarizing spin on film is blanket etched back to uncover the gate hardmask while maintaining an etched back self planarizing spin on film on the implanted source/drain regions. The gate hardmask is etched back while the etched back self planarizing spin on film remains in place to protect the implanted source/drain regions. The etched back self planarizing spin on film is removed.

The gate region may be low energy implanted prior to removing the etched back self planarizing spin on film to lower sheet resistance of the polysilicon layer.

The self planarizing spin on film may be an organic dielectric layer.

The etched back self planarizing spin on film may be removed by a wet or dry removal process.

The method may further include performing source/drain implant activation and salicidation after removing the etched back self planarizing spin on film.

The blanket etching back may further include determining an end point of the etching back in real time by predicting an approaching exposure of the gate hardmask and controlling etching back time after an approaching exposure is predicted.

Predicting an approaching exposure may include bouncing a beam of light through the semiconductor device in real time as the etching back proceeds and developing an interference pattern between components of light that are reflected at a first interface between self planarizing spin on film and a plasma chamber used in the etching back and a buried interface between the self planarizing spin on film and implanted source/drain regions underneath the first interface, and developing a fringe pattern that allows for an awareness of an approaching exposure of the buried hardmask before an actual exposure.

Controlling the etching back time may include maintaining the etching back for a predetermined amount of time after achieving the awareness of the approaching exposure.

In accordance with an exemplary embodiment a method is provided for fabricating a semiconductor device having implanted source/drain regions and a gate region, the gate region having been masked by the gate hardmask during source/drain implantation, the gate region having a polysilicon gate layer layered on a metal layer that is layered on a high-K dielectric layer. The gate region and the source/drain regions are covered with an organic dielectric layer. The organic dielectric layer is blanket etched back to uncover the gate hardmask while maintaining an etched back organic dielectric layer on the implanted source/drain regions. The gate hardmask is etched out while the etched back organic dielectric layer remains in place to protect the implanted source/drain regions. The gate region is low energy implanted.

The etched back organic dielectric layer is then removed. Source/drain implant activation and salicidation are performed after removing the etched back organic dielectric layer. The organic dielectric layer may be spun on to cover the gate region and the source/drain regions.

Sides of the gate region may be covered by spacers and ends of the spacers distal from the source/drain regions may protrude above the etched back organic dielectric layer after etching out the gate hardmask.

The low energy implanting may be for lowering the sheet resistance of the polysilicon layer.

The etched back organic dielectric layer may be removed by a wet or dry removal process.

BRIEF DESCRIPTION OF THE SEVERAL VIEWS OF THE DRAWINGS

Exemplary embodiments of the present disclosure will be more clearly understood from the following detailed description taken in conjunction with the accompanying drawings in which.

DETAILED DESCRIPTION

Figure 1:
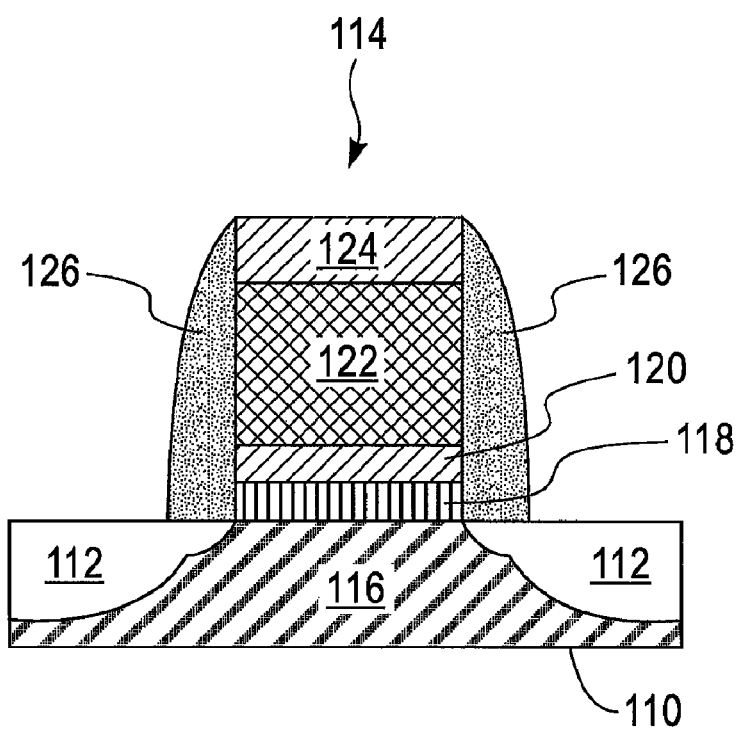
FIG. 1 depicts a conventional PC gate hardmask configuration for a CMOS semiconductor device after source/drain implant.

Reference will now be made in detail to the exemplary embodiments, examples of which are illustrated in the accompanying drawings, wherein like reference numerals refer to the like elements throughout.

In the figures, the dimensions of layers and regions may be exaggerated for clarity. It will be understood that when a layer or element is referred to as being "on" another layer or element, it can be directly on the other layer or element, or intervening layers may also be present. Further, it will be understood that when a layer is referred to as being "under" another layer or element, it can be directly under the layer or element, or one or more intervening layers or elements may also be present. In addition, it will be understood that when a layer or an element is referred to as being "between" two layers or elements, it can be the only layer between the two layers or elements, or one or more intervening layers or elements may also be present.

Referring now to FIGS. 2A-2E, there is shown a fabrication sub-process for a semiconductor device according to an exemplary embodiment of the present disclosure.

Figure 2A:
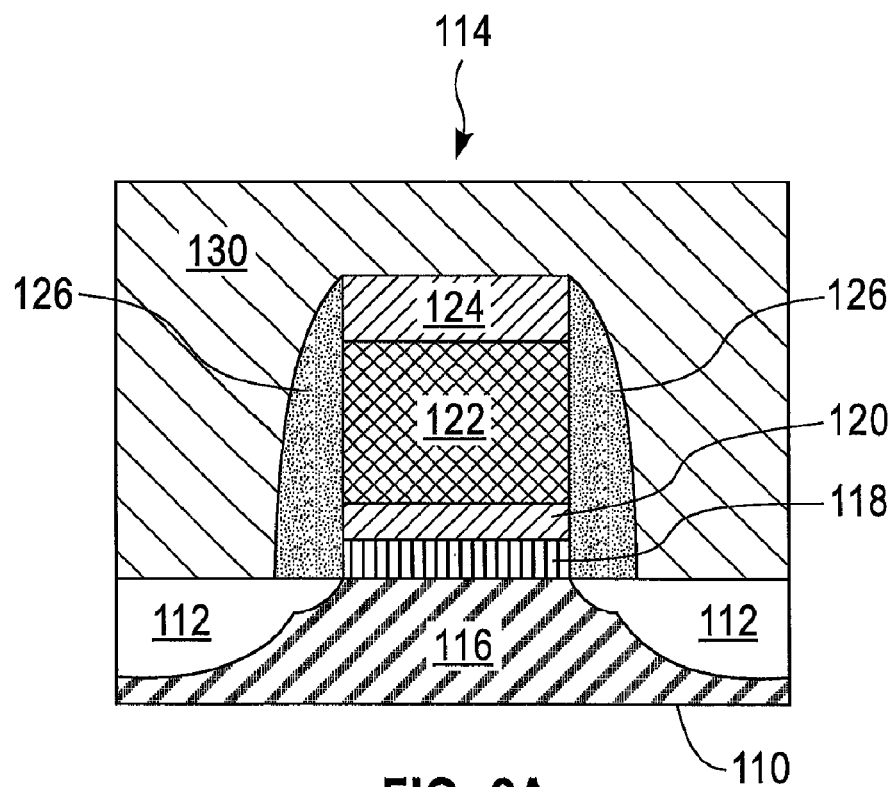
FIGS. 2A, 2B, 2C, 2D and 2E depict the process for removal of the hardmask of FIG. 1 to allow for silicidation and gate implant in accordance with an exemplary embodiment of the present disclosure.

In FIG. 2A, after the source/drain regions 112 of the semiconductor device depicted in FIG. 1, have been implanted, a self planarizing spin on film 130, such as an organic dielectric layer (ODL), may be spun on covering the gate region 114 and the implanted source/drain regions 112.

Figure 2B:
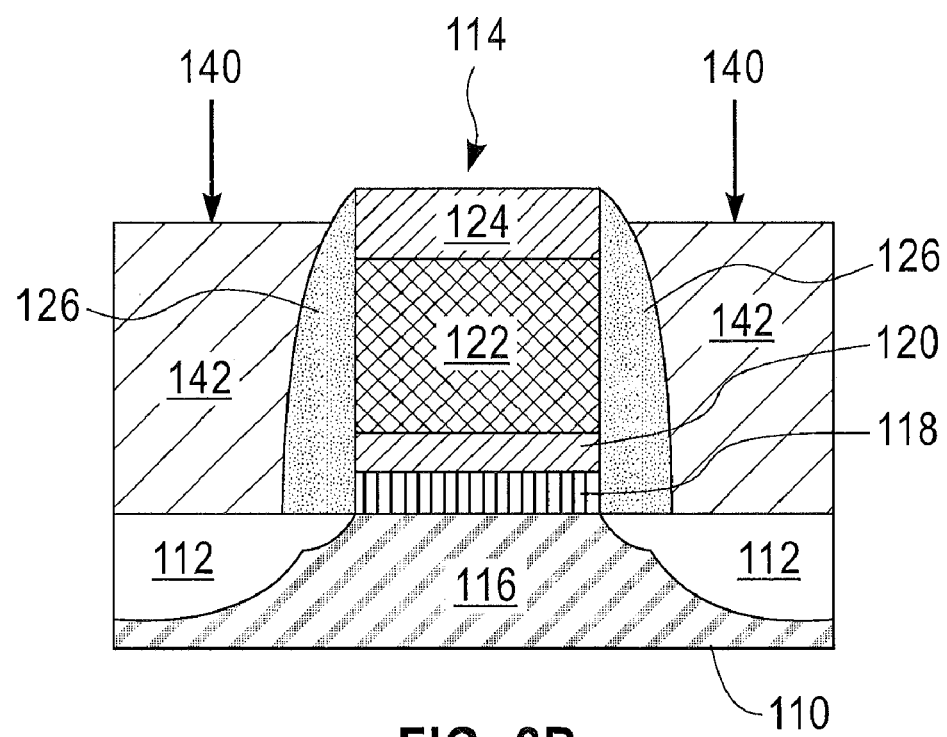

In FIG. 2B, blanket etch back 140 may be performed to provide etched back ODL 142 uncovering hardmask 124 and having sufficient overetch (OE) for gate stack and shallow trench isolation (STI) induced topography across the SOI uniformly.

Those skilled in the art can appreciate that the etch back process, if not stopped at the right point in time, can result in a run away removal that exposes the source/drain regions inadvertently. Hence, in accordance with an exemplary embodiment a real time endpoint control process may be provided. In an exemplary embodiment a predicative endpoint may involve the use of an interferometric endpoint. Not withstanding small incoming variations in film thickness or etch rate of the film, the etch back process may be stopped soon after revealing the top of the gate region 114, i.e., hardmask 124, without exposing source/drain regions 112. A beam of light may be bounced through the wafer in real time as the etch back proceeds and an interference pattern between the components of light that are reflected at the various interfaces may be watched. The principal interfaces may be a first interface between film 130 and the plasma chamber used in etch back and the buried interface between film 130 and source/drain regions 112 underneath the first interface. Hence, a fringe pattern may be developed that allows for an awareness of an approaching exposure of the buried hardmask 124 (i.e., a predictive exposure) before an actual exposure. From then on the etching back may be fixed for a controllably small amount of time so as to prevent a run away exposure of source/drain regions 112 allowing the etched back ODL 142 to still protect source/drain regions 112 and most of spacers 126.

Figure 2C:
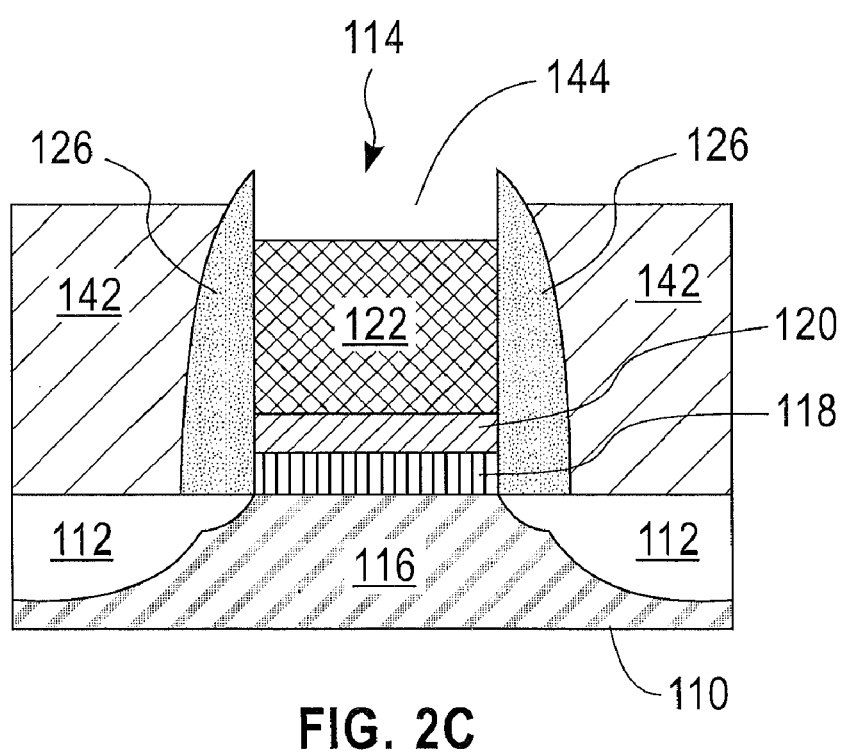

Referring now to FIG. 2C, hardmask 124 may be etched out leaving etched out area 144, while etched back ODL 142 still remains in place protecting source/drain regions 112 and most of spacers 122.

Figure 2D:
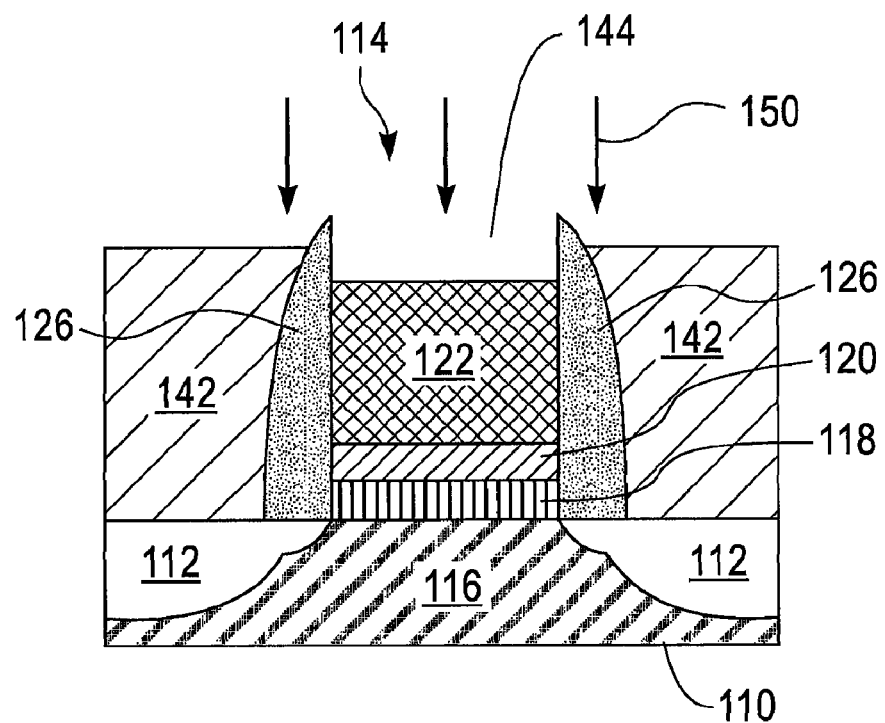

In FIG. 2D, a low energy (low range) implant 150, with etch back ODL 142 still in place protecting source/drain regions 112 and most of spacers 122, can be performed to lower the sheet resistance (rho) of PC 122 without punching dopants into metal gate 120 and high-K dielectric 118.

Figure 2E:
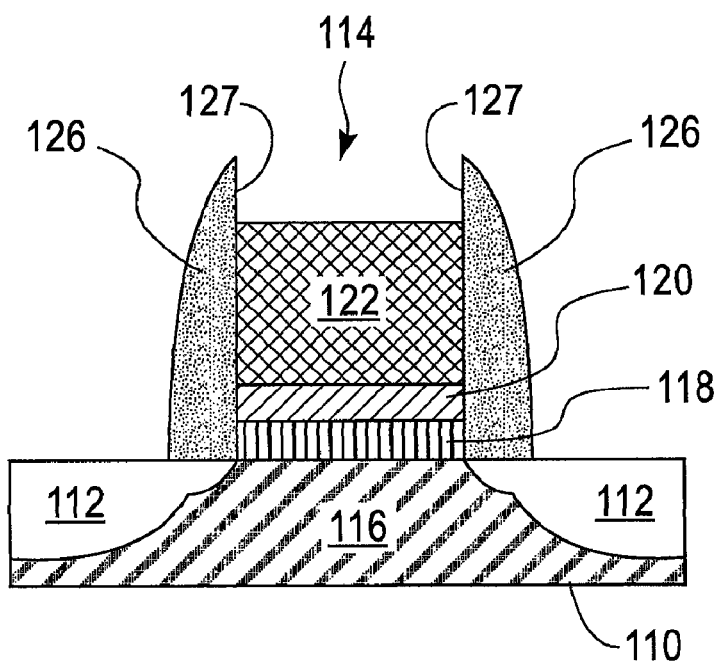

Referring to FIG. 2E, a wet or dry removal of ODL 142 from the source/drain regions 112 and spacers 122 may be then performed. Portions 127 of the spacers 122 can stick out as horns after the hardmask 124 removal, allowing the flow to be revealed to those skilled in the art.

After the removal of ODL 142 a combined activation of the source/drain dopants and the gate dopants can be performed. Salicidation can also then proceed.

Those skilled in the art will appreciate that the present disclosure would be useful for implant tool vendors, and for scientific services, for example, materials research, life sciences research, logistics research.

While exemplary embodiments have been particularly shown and described, it will be understood that various changes in form and details may be made therein without departing from the spirit and scope of the following claims.

What is claimed is:

1. A method of fabricating a semiconductor device having implanted source/drain regions and a gate region, the gate region having been masked by the gate hardmask during a source/drain implantation, the gate region having a polysilicon gate layer layered on a metal layer that is layer on a high-K dielectric layer, the method comprising:
   covering the gate region and the source/drain regions with a self planarizing spin on film;
   blanket etching back the self planarizing spin on film to uncover the gate hardmask while maintaining an etched back self planarizing spin on film on the implanted source/drain regions;
   etching out the gate hardmask while the etched back self planarizing spin on film remains in place to protect the implanted source/drain regions; and
   removing the etched back self planarizing spin on film.

2. The method of claim 1, further comprising low energy implanting of the gate region prior to removal of the etched back self planarizing film to lower sheet resistance of the polysilicon layer.

3. The method of claim 1, wherein the self planarizing spin on film is an organic dielectric layer.

4. The method of claim 1, wherein the etched back self planarizing spin on film is removed by a wet or dry removal process.

5. The method of claim 1, further comprising performing source/drain implant activation and salicidation after removing the etched back self planarizing spin on film.

6. The method of claim 1, wherein the blanket etching back further comprises determining an end point of the etching back in real time by predicting an approaching exposure of the gate hardmask and controlling etching back time after an approaching exposure is predicted.

7. The method of claim 6, wherein predicting an approaching exposure comprises:

bouncing a beam of light through the semiconductor device in real time as the etching back proceeds and developing an interference pattern between components of light that are reflected at a first interface between self planarizing spin on film and a plasma chamber used in the etch backing and a buried interface between the self planarizing spin on film and implanted source/drain regions underneath the first interface; and developing a fringe pattern that allows for an awareness of an approaching exposure of the buried hardmask before an actual exposure.

8. The method of claim 7, wherein controlling the etching back time comprises maintaining the etching back for a predetermined amount of time after achieving the awareness of the approaching exposure.

9. A method of fabricating a semiconductor device having implanted source/drain regions and a gate region, the gate region having been masked by the gate hardmask during source/drain implantation, the gate region having a polysilicon gate layer layered on a metal layer that is layered on a high-K dielectric layer, the method comprising:

covering the gate region and the source/drain regions with an organic dielectric layer;

blanket etching back the organic dielectric layer to uncover the gate hardmask while maintaining an etched back organic dielectric layer on the implanted source/drain regions;

etching out the gate hardmask while the etched back organic dielectric layer remains in place to protect the implanted source/drain regions;

low energy implanting of the gate region;

removing the etched back organic dielectric layer; and performing source/drain implant activation and salicidation after removing the etched back organic dielectric layer.

10. The method of claim 9, wherein the organic dielectric layer is spun on to cover the gate region and the source/drain regions.

11. The method of claim 9, wherein sides of the gate region are covered by spacers and ends of the spacers distal from the source/drain regions protrude above the etched back organic dielectric layer after etching out the gate hardmask.

12. The method of claim 9, wherein the low energy implanting is for lowering the sheet resistance of the polysilicon layer.

13. The method of claim 9, wherein the etched back organic dielectric layer is removed by a wet or dry removal process.

* * * * *